(12) United States Patent
Chen et al.

(10) Patent No.: US 9,310,437 B2
(45) Date of Patent: Apr. 12, 2016

(54) ADAPTIVE TEST SEQUENCE FOR TESTING INTEGRATED CIRCUITS

(75) Inventors: Chun-Cheng Chen, Hsin-Chu (TW); Hung-Chih Lin, Hsin-Chu (TW); Mill-Jer Wang, Hsin-Chu (TW); Hao Chen, Luzhou (TW); Ching-Nen Peng, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 823 days.

(21) Appl. No.: 13/072,325

(22) Filed: Mar. 25, 2011

(65) Prior Publication Data

US 2012/0246514 A1 Sep. 27, 2012

(51) Int. Cl.
*G01R 31/02* (2006.01)
*G01R 31/319* (2006.01)
*G01R 31/3183* (2006.01)
*G01R 31/3185* (2006.01)

(52) U.S. Cl.
CPC .. *G01R 31/31919* (2013.01); *G01R 31/318371* (2013.01); *G01R 31/318511* (2013.01)

(58) Field of Classification Search
CPC ........ H01L 22/00; G05B 23/02; G01R 31/26; G01R 31/318371; G01R 331/31919; G01R 31/3485–31/318513
USPC ............ 324/762, 762.05, 750.3, 185, 750.01, 324/750.08, 762.01–762.03; 714/724, 726, 714/733, 734, 742; 700/101
See application file for complete search history.

(56) References Cited

U.S. PATENT DOCUMENTS

| | | | | |
|---|---|---|---|---|
| 5,998,228 | A * | 12/1999 | Eldridge et al. | 438/15 |
| 6,078,189 | A * | 6/2000 | Noel | 324/750.01 |
| 6,367,041 | B1 | 4/2002 | Statovici et al. | |
| 6,618,682 | B2 * | 9/2003 | Bulaga et al. | 702/84 |
| 6,857,090 | B2 * | 2/2005 | Lee et al. | 714/724 |
| 7,035,770 | B2 * | 4/2006 | Lin et al. | 702/185 |
| 7,047,463 | B1 * | 5/2006 | Organ et al. | 714/724 |
| 7,260,744 | B2 * | 8/2007 | Wu | 714/26 |
| 7,260,750 | B2 * | 8/2007 | Wu | 714/46 |
| 7,263,634 | B2 * | 8/2007 | Wu et al. | 714/46 |
| 7,432,729 | B2 * | 10/2008 | Noel et al. | 324/750.05 |

(Continued)

OTHER PUBLICATIONS

Grochowski, A. et al., Integrated Circuit Testing for Quality Assurance in Manufacturing: History, Current Status, and Future Trends, Aug. 1997, IEEE, vol. 44 No. 08, pp. 610-633.*

(Continued)

*Primary Examiner* — Jermele M Hollington
*Assistant Examiner* — Demetrius Pretlow
(74) *Attorney, Agent, or Firm* — Slater & Matsil, L.L.P.

(57) ABSTRACT

A method includes testing a first device and a second device identical to each other and comprising integrated circuits. The testing of the first device is performed according to a first test sequence of the first device, wherein the first test sequence includes a plurality of ordered test items, and wherein the first test sequence includes a test item. A test priority of the test item is calculated based on a frequency of fails of the test item in the testing of a plurality of devices having an identical structure as the first device. The first test sequence is then adjusted to generate a second test sequence in response to the test priority of the test item, wherein the second test sequence is different from the first test sequence. The second device is tested according to the second test sequence.

11 Claims, 6 Drawing Sheets

(56) References Cited

U.S. PATENT DOCUMENTS

2009/0310685 A1* 12/2009 Schmidt et al. .......... 375/240.24
2014/0203829 A1* 7/2014 Yamada ................... 324/750.08

OTHER PUBLICATIONS

Gotkhindikar, K. R. et al., Die-Level Adaptive Test: Real-time Test Reordering and Elimination, 2011, IEEE International Test Conference, Paper 15.1, pp. 1-10.*

Schnurmann, H. D. et al., The Weighted Randon Test-Pattern Generator, Jul. 1975, IEEE Transactions on Computers, pp. 695-700.*

Yu, P. S. et al., VLSI Circuit Testing Using Adaptive Optimization Model, IEEE Design Automation Conference, 1987, Paper 24.3, pp. 399-406.*

Benner, S., et al., "Optimal Production Test Times Through Adaptive Test Programming," ITC International Test Conference, 2001, IEEE, Paper 32.2, pp. 908-915.

* cited by examiner

ADAPTIVE TEST SEQUENCE FOR TESTING INTEGRATED CIRCUITS

BACKGROUND

Integrated circuits are formed on wafers and then sawed into dies. The dies are packaged as packages before they are used. To ensure that the reliability and the performance of the integrated circuits meet specifications, the packaged dies are tested. The testing of integrated circuits further includes the testing of individual dies, which may be system-on-chip (SoC) dies. In the testing of each die or package, there may be multiple test items that need to be executed.

Conventionally, the testing were performed using a fixed sequence of the test items, and the testing of wafer probing on all dies or packages that have the same structure is performed according to the same pre-defined fixed sequence. In the packages with stacked dies, the testing was often performed die-by-die, that is, all test items for one die are executed, and then the test items for another die are executed. This method, however, has a low efficiency since some of the test items are prone to failure. Accordingly, if such test items are executed behind those test items not prone to failure, the time of finding the failed test items is delayed, and the testing of the test items that are not prone to failure are actually wasted. To overcome this drawback, various methods were proposed.

In one of the methods, the test results of wafer probing on dies or packages are analyzed after a plurality of dies or packages are tested, and those test items don't seem to suffer from failure were skipped. This method, although resulted in lower test cost, may incur a high penalty when a die does fail on the skipped test item. In this case, since the test item is skipped, the failure die wrongfully passes the test.

In another method, if a die or a package fails on a test item, this most recently failed test item is adjusted as the very first (top) test item of the test sequence, and the testing of the next die starts from the most recently failed test item. It is observed, however, that some of the most recently failed test items may happen to be the test item that seldom suffers from failure. For example, a die may fail on a test item that almost always passes. Accordingly, the next die, and possibly many dies after the next die, will be tested starting from this test item. It may take many failed dies before this test item sinks to the bottom of the test sequence. Therefore, the test sequence of this method is also not optimized.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are merely illustrative, and do not limit the scope of the disclosure.

Figure 1:
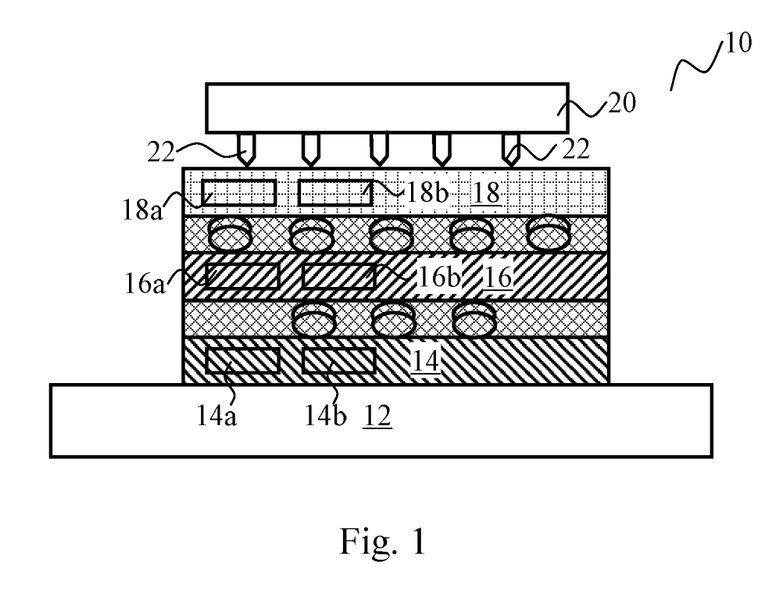
FIG. 1 illustrates a device, which is a package comprising a bottom die, an intermediate die, and a top die stacked on a prober chuck.

A method of for testing integrated circuits is provided in accordance with an embodiment. The variations and the operation of the embodiment are discussed. Throughout the various views and illustrative embodiments, like reference numbers are used to designate like elements. The concept of the embodiments is explained using the exemplary package as shown in FIG. 1. It is realized, however, that the tested devices may have a different structure than what is shown in FIG. 1, and the testing of the packages or chips on wafer having different structures are also in the scoped of the present disclosure. Also, the test methods of the embodiments may be applied on the testing of various types of devices, such as individual dies, three-dimensional integrated circuits (3DIC), system-on-chip (SoC) dies, and the like.

FIG. 1 illustrates device 10 that is to be tested. In an exemplary embodiment, device 10 is a package including one or more dies packaged therein. Prober chuck 12 is provided, and is configured to be set to desirable temperatures, which may be, for example, from room temperature (25° C.) to about 140° C. The methods provided by the embodiments may also be used on the testing of devices under various different temperatures (for example, below 0° C.). Other methods rather than using prober chuck thus may be used to cool or heat the tested devices to different temperatures.

In an exemplary embodiment, bottom die 14, intermediate die 16, and top die 18 are stacked, and are heated by prober chuck 12. In an embodiment, bottom die 14 includes thermal sensor 14a for sensing temperature, and/or stress sensor 14b for sensing the stress in die 14. Furthermore, intermediate die 16 includes thermal sensor 16a, and/or stress sensor 16b. Top die 18 includes thermal sensor 18a, and/or stress sensor 18b. Accordingly, the temperature and/or the stress in each of dies 14, 16, and 18 may be sensed (measured). The test of dies 14, 16, and 18 may be performed through probe card 20, which includes probe pins 22 for probing the contact pads (not shown) in top die 18.

Figure 2:
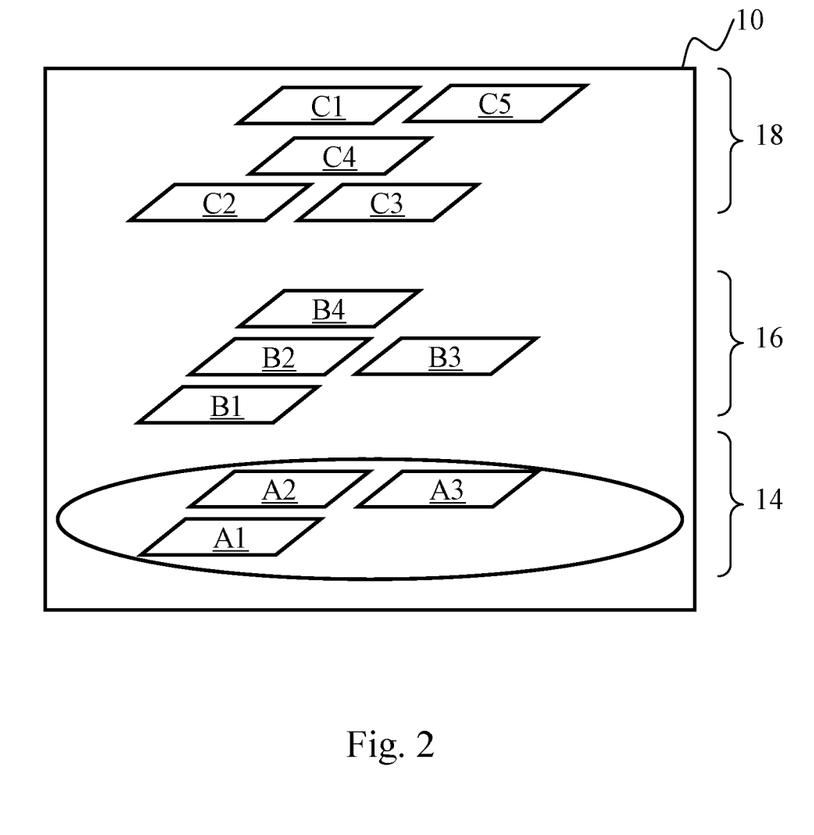
FIG. 2 illustrates a logic view of the device shown in FIG. 1, wherein the test items of the device are illustrated.

FIG. 2 illustrates a logic view of the test items for dies 14, 16, and 18. The testing of each of dies 14, 16, and 18 may include one or more test items that need to be executed. In the illustrated exemplary embodiment, the testing of die 14 includes test items A1, A2, and A3, the testing of die 16 includes test items B1, B2, B3, and B4, and the testing of die 14 includes test items C1, C2, C3, C4, and C5. In the testing of package 10 as in FIG. 1, the test items are executed one by one, and if device 10 passes all of the test items, it is determined that device 10 is a good device. If any of the test items fails, device 10 is determined as being a failed device, and the test of device 10 stops. Accordingly, it is more efficient to execute the test items that are more likely to fail in early stages of the test.

Figure 3:
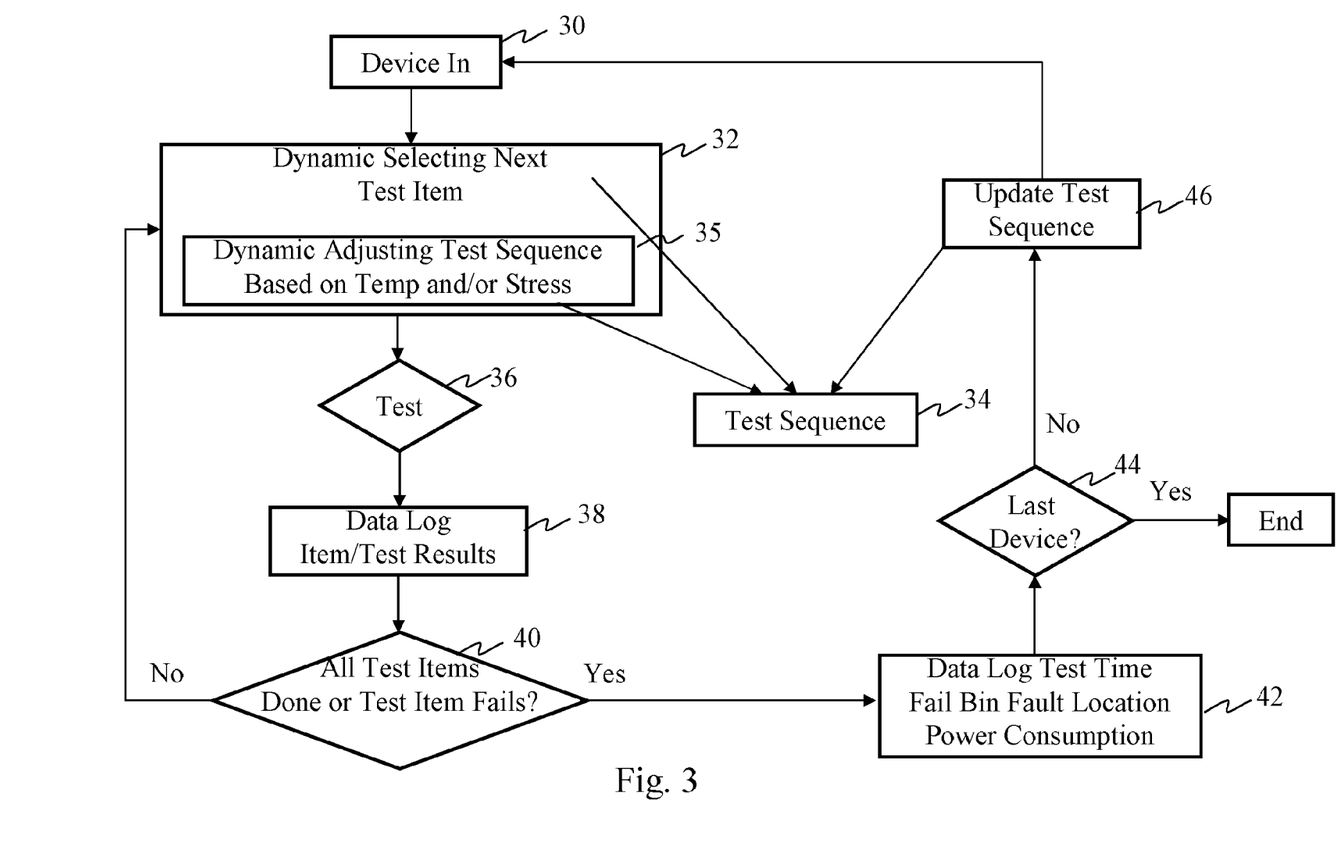
FIG. 3 illustrates a flow chart for testing the device shown in FIG. 1 in accordance with various embodiments.
Figure 4:
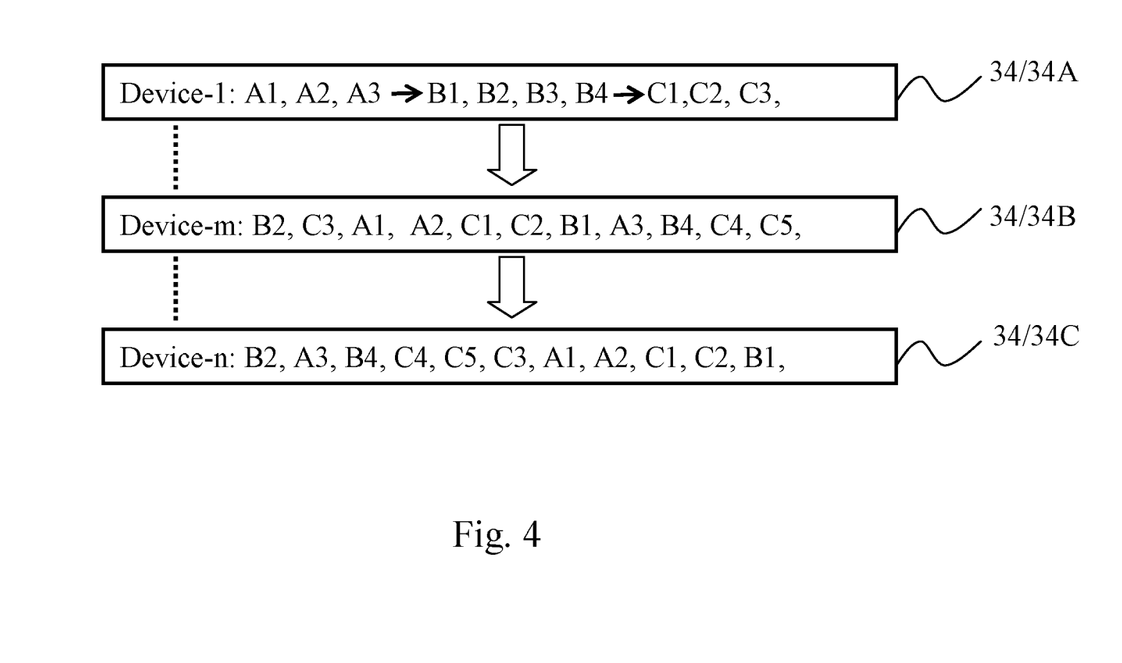
FIG. 4 illustrates the dynamic adjustment of test sequences in response to the test results of devices.

FIG. 3 illustrates a flow chart for testing a plurality of devices (such as device 10 in FIG. 1 or a single chip on a wafer) having an identical structure. First, the test is started (step 30), and a first test device (device-1) is received for testing. Step 30 may include, for example, placing device-1 on prober chuck 12 as shown in FIG. 1, and heating prober chuck 12 to a desirable temperature. Next, in step 32, the very first test item (referred to as top test item hereinafter) is selected from test sequence 34, in which all test items to be executed are listed in a sequential order. The test of test items is performed according to the order specified by test sequence 34. FIG. 4 illustrates an exemplary sequence 34, which illustrates test sequence 34 (denoted as 34A) at the time device-1 is received, and the dynamic change of test sequence 34 with the proceeding of the test. In an embodiment, test sequence 34A for testing device-1 may be in the die-by-die order. For example, as shown in FIG. 4, test items A1, A2, and A3 for die 14 (FIG. 1) are sequentially executed first, followed by the sequential execution of test items B1 through B4 for die 16, and further followed by the sequential execution of test items C1 through C5. In alternative embodiments, test sequence 34A may not be in the die-by-die order. For example, test sequence 34A may be ordered according to test time, with the test items requiring shorter test time listed ahead of the test items requiring longer test time. Alternatively, test sequence 34A may be ordered according to the failed probability, with the test items having higher possibilities of failure listed ahead of the ones having lower possibilities of failure.

Referring back to FIG. 3, the top test item (test item A1 in the exemplary embodiment shown in FIG. 4) is then executed (step 36) for device-1, and the results from test item A1 are logged (step 38). In step 40, it is determined whether all test items of device-1 have been executed. If there are remaining test items in test sequence 34 to be executed, the flow goes back to step 32, so that the next test item (A2 in FIG. 4) is selected, and steps 36 and 38 are repeated for the next test item. The loop including steps 32 through 40 is repeated until all test items in test sequence 34 is executed. If all test items of device-1 have been executed, a data log of device-1 is generated (step 42), and is compile with the test results from other tested devices. The data log may include the performance data such as drive currents Idd, bias voltage Vbias, speed, frequency, power consumption, and the like. The data log may further include the test time, fault locations, and the like. If the tested device fails, it is also placed into a respective fail bin for holding the failed devices. In the dynamic adjustment of test sequence 34, the data in data bin are evaluated.

Next, in step 44, it is determined whether all devices have been tested, and the test ends if all devices have been tested. Otherwise, the test flow proceeds to step 46, and depending on the test results of device-1, test sequence 34 may be, or may not be, updated. The flow chart then loops back to step 30, and the next device to be tested is selected. Steps 32 through 46 are then repeated for the next device. It is observed that at this time, test sequence 34 may have been updated, and hence may be different from the test sequence 34A. For example, referring to FIG. 4, at the time device-m is tested, test sequence 34 may become 34B, which is B2, C3, A1, A2, C2, C2, B1, A3, B4, C4, C5. When the test further proceeds, at the time device-n is tested, test sequence 34 may become 34C, which is B2, A3, B4, C4, C5, C3, A1, A2, C1, C2, B1. Accordingly, test sequence 34 is dynamically adjusted with the proceeding of the tests. The dynamic adjustment of test sequence 34 is discussed referring to FIG. 5.

Figure 5:
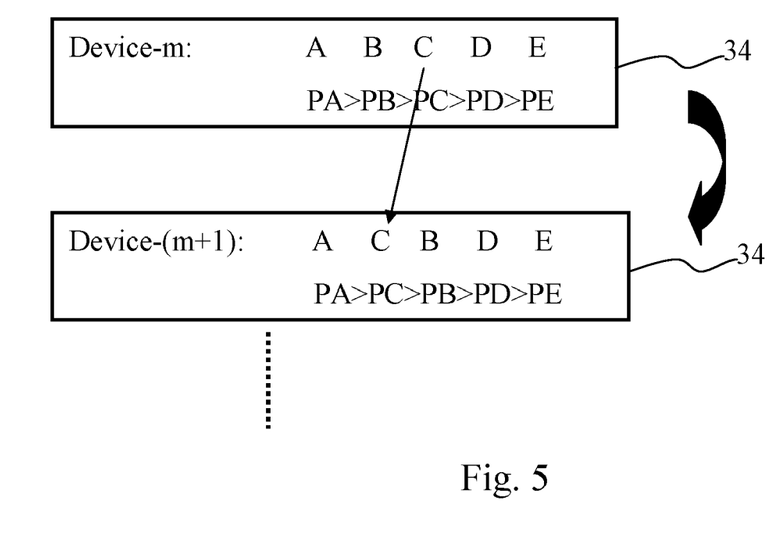
FIG. 5 illustrates the adjustment of the test sequence in accordance with the fail probability that comes out from various algorithms.

FIG. 5 is used to explain the algorithms used for adjusting test sequence 34. In each of the algorithms, a test priority is calculated for each of the test items. The test sequence is then ordered according to the test priorities of the test items, for example, in the ascending order or descending order, depending on how test priorities are defined. In an embodiment, the test items are ordered in the descending order, with the test items having higher priorities placed in front of the test items with lower test priorities. For example, as shown in FIG. 5, if test priorities PA, PB, PC, PD, and PE of the respective test items A, B, C, D, and E have values PA>PB>PC>PD>PE, the test sequence is ordered as A, B, C, D, and E.

The calculation of the test priorities may include a most frequently fail (MFF) algorithm. In this algorithm, test priority P of a test item is calculated as:

$$P=\text{Fail\_count}/\text{Total\_Tested\_Devices} \qquad [\text{Eq. 1}]$$

Wherein "Fail_count" represents the count of all failed devices among all tested devices (Total_Tested_Devices), which failed devices failed on the test item. According to Equation 1, whenever a test of a device fails on one test item, the respective test priority P increases, which may, or may not, cause the order of the test priorities of test items to be changed. For example, referring to FIG. 5, assuming when device-m is tested, the test priority values have the relationship PA>PB>PC>PD>PE. Accordingly, the test sequence is A, B, C, D, E. If device-m fails on test item C, this may, or may not, cause priority PC of test item C to be increased over test priority PB of test item B. If test priority PC is increased to be greater than PB but smaller than PA, the test priority values have the relationship PA>PC>PB>PD>PE. Accordingly, the test sequence is adjusted as A, C, B, D, E, as shown in FIG. 5, and the test of device-(m+1) will use this adjusted test sequence. It is observed that by using this algorithm, when the sequence of test item C is promoted, it may or may not be promoted as the top test item of test sequence 34.

FIG. 5 may also be used to represent the algorithm of temporal frequent fail (TFF). This algorithm is similar to the MFF algorithm, except the calculation of test priority P of a test item is expressed as:

$$P=\text{Recent\_Fail\_count}/\text{Recent\_Tested\_Devices} \qquad [\text{Eq. 2}]$$

Wherein "Recent_Fail_count" is the count of failed devices among recently sampled tested devices (Recent_Tested_Devices), which failed devices failed on the test item. The Recent_Tested_Devices may range from 1 to all tested devices that have been tested. In an exemplary embodiment, the Recent_Tested_Devices represents the most recently tested 50 (or any other number greater than 1) devices. By using the TFF algorithm, the most recently tested devices and the corresponding failed devices are taken into the account in the adjustment the test sequence, while earlier tested devices are not counted.

The calculation of the test priorities may also be weighted. For example, each of the test items may be assigned with a weight ranging from 0 to 1. A test item with a higher weight has a greater chance to be moved to the front of the test sequence, while a test item with a lower weight has a smaller chance to be moved to the front of the test sequence. The assignment of the weights of the test items may take into various factors. For example, the test items taking longer time to finish may be assigned with smaller weights. Furthermore, the test items requiring more power consumption may be assigned with smaller weights because if they are test first, they are more likely to cause the temperature change in the tested device, and hence affecting the execution of subsequent test items.

The test priority P of a test item in the algorithm of weighted most frequent fail (WMFF) may be expressed as:

$$P=(\text{Weight}*\text{Fail\_count})/\text{Total\_Tested\_Devices} \qquad [\text{Eq. 3}]$$

Wherein "Weight" is the assigned weight of the test item. The WMFF algorithm may also be illustrated using FIG. 5.

The test priority P of a test item in the algorithm of weighted temporal frequent fail (WTFF) may be expressed as:

$$P = (\text{Weight} * \text{Recent\_Fail\_count}) / \text{Recent\_Tested\_Devices} \quad [\text{Eq. 4}]$$

Wherein "Weight" is the assigned weight of the test item. Again, the WTFF algorithm may also be illustrated using FIG. 5.

It is observed that per Equations 1 and 4, a fail on a test item may, or may not, cause the test sequence to be adjusted. Even though a fail on a test item may result in the increase in the test priority of this test item, if the test priority is not increased to the degree that it is greater than the test priority of the test items in front of it in the test sequence, the test sequence may still stay the same.

In FIG. 5 and Equations 1 through 4, the dynamic adjustment of test sequence 34 and the calculation of test priorities are based upon the possibility of failure, wherein test items that are more likely to fail are tested first. Additional factors may also be considered in the dynamic adjustment of test sequence 34 and the dynamic selection of test items (step 32) in FIG. 3. Referring back to FIG. 1, as shown in step 35, during the execution of test items, the temperature and the stresses of dies 14, 16, and 18 may be monitored. If the temperature and/or the stress exceed pre-specified threshold values, some of the test items that are to be executed may be dynamically pushed to relatively back positions in test sequence 34 to generate a new test sequence, and the testing of the device will be finished according to the newly generated test sequence 34. Accordingly, the temperature and the stress may also cause the adjustment of test sequence 34 as shown in FIGS. 3 and 4. The dynamic adjustment of test sequence 34 is shown in FIG. 3 as step 35.

Figure 6:
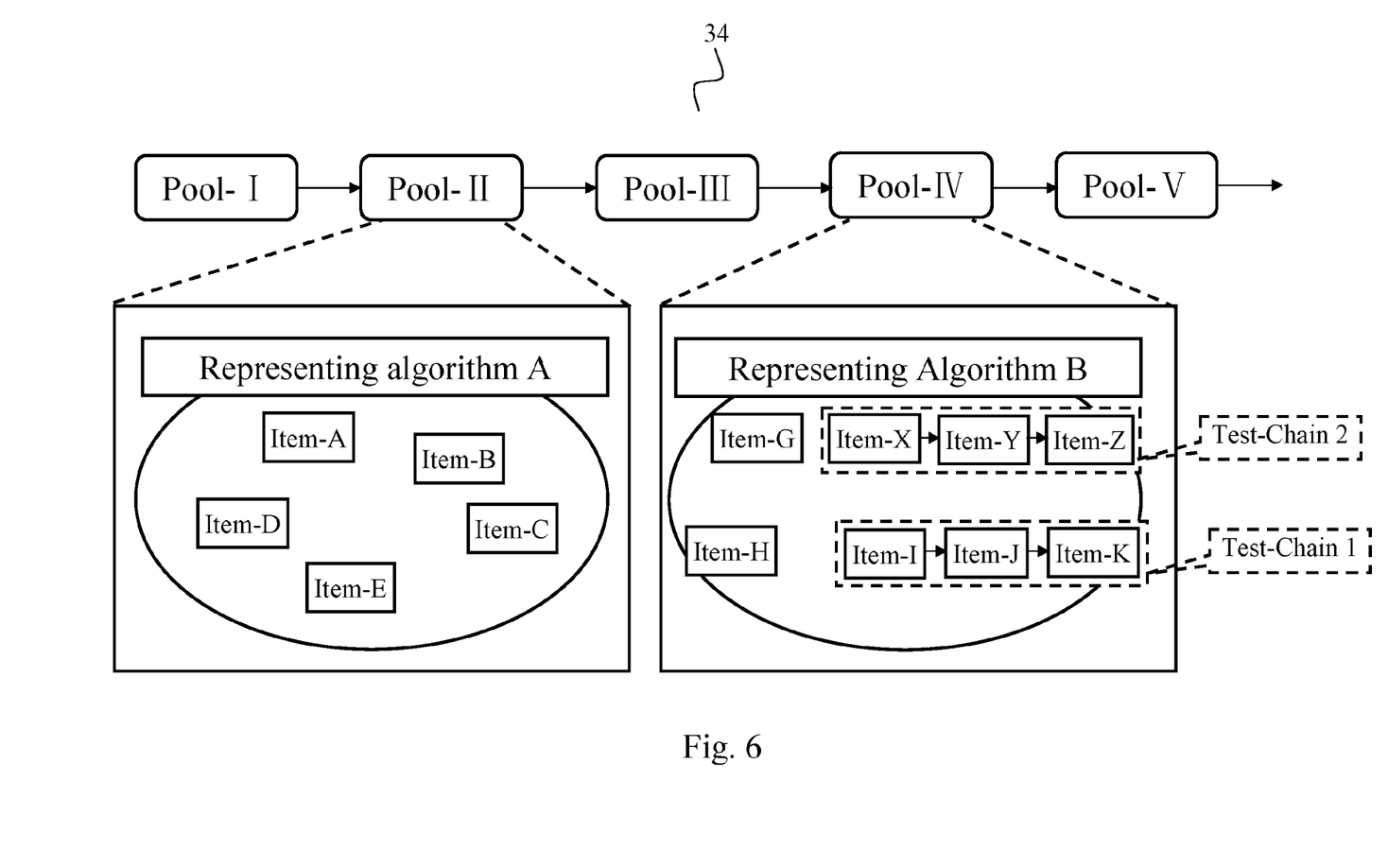
FIG. 6 illustrates a hybrid test sequence with "test pool in test chain" and "test chain in test pool" embedded therein.

Referring to FIG. 6, test sequence 34 may be a hybrid of test item pools (such as Pool-I, Pool-II, Pool-IIII, Pool-IV, and Pool-IV) and test (item) chains. In a test item pool, a plurality of test items may be tested in any order. Accordingly, at the time test sequence 34 is determined, the test items in the same test item pool may be tested in any order, depending on the determination results obtained through Equations 1 through 4, for example. Each of the test item pools may include test items of a test module, such as a die, a functional block of a die, a functional block comprising components from multiple dies, and the like. As an example, in FIG. 6, Pool-II is a test item pool, and test items Item-A, Item-B, Item-C, Item-D, and Item-E may be tested in any order. On the other hand, test item pools Pool-I, Pool-II, Pool-IIII, Pool-IV, and Pool-IV may have a fixed sequence, and hence may form a test chain. Inside each of the test item pools, there may be test chains, such as test chain item_1 and test chain item_2. Accordingly, FIG. 6 illustrates the hybrid of test pools and test chains.

In a test chain, a plurality of test items has to be tested in a fixed order. This often occurs when some of the test items have dependency on other test items. For example, in Pool-IV in FIG. 6, test-chain item_1 includes test items I, J and K, and has to be tested in the sequence Item-I, Item-J, Item-K. Similarly, test-chain item_2 includes test items X, Y, and Z, and has to be tested in the sequence Item-X, Item-Y, Item-Z. Each of test-chain item_1 and test-chain item_2, however, is treated as an integrated unit that can be pooled with other test items. For example, in Pool-IV in FIG. 6, test items Item-G, Item-H, test-chain item_1, and test-chain item_2 may be tested in any order. Each of the test chains may be represented using a test priority, and the test chains may be ordered according to the calculated test priorities.

In FIG. 6, each of the test item pools may have its own test algorithm, which may be the same as or different from the algorithms in other test item pools. For example, test item pool-II may use algorithm A, while test item pool-II may use algorithm B.

By using the embodiments, the test scheme of integrated circuits may adapt to the various factors that affect the cost and the reliability of the test, so that optimal test sequences may be generated and used.

In accordance with embodiments, a method includes testing a first device and a second device identical to each other and comprising integrated circuits. The testing of the first device is performed according to a first test sequence of the first device, wherein the first test sequence includes a plurality of ordered test items, and wherein the first test sequence includes a test item. A test priority of the test item is calculated based on a frequency of fails of the test item in the testing of a plurality of devices having an identical structure as the first device. The first test sequence is then adjusted to generate a second test sequence in response to the test priority of the test item, wherein the second test sequence is different from the first test sequence. The second device is tested according to the second test sequence.

In accordance with other embodiments, a method includes testing a first device according to a first test sequence. The step of testing the first device includes executing a first test item in the first test sequence; and after the step of executing the first test item, executing a second test item in the first test sequence. The second test item fails. The method further includes, after the step of testing the first device, testing a second device identical to the first device according to a second test sequence different from the first test sequence. The step of testing the second device includes executing a top test item in second test sequence; after the step of executing the top test item, executing the second test item in the second test sequence; and after the step of executing the second test item, executing the first test item.

In accordance with yet other embodiments, a method includes testing a device according to a first test sequence. The step of testing the device includes executing a first test item in the first test sequence, and, after finishing executing the first test item, measuring a parameter selected from the group consisting of a temperature of the device, a stress of the device, and combinations thereof. The method further includes adjusting the first test sequence to generate a second test sequence in response to the parameter, wherein the second test sequence is different from the first test sequence; and executing remaining test items in the first test sequence according to an order of the second test sequence.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addi-

What is claimed is:

1. A method comprising:
   testing a first device comprising integrated circuits according to a first test sequence of the first device, wherein the first test sequence comprises a plurality of ordered test items, and wherein the first test sequence comprises a first test item;
   calculating a test priority of the first test item based on a frequency of fails of the first test item in the testing of a plurality of devices having an identical structure as the first device, wherein the calculating the test priority of the first test item comprises:
   assigning a first weight to the first test item;
   multiplying the first weight by a total count of failed ones of the plurality of devices that failed in the first test item to obtain a product; and
   dividing the product by a total count of the plurality of devices;
   adjusting the first test sequence to generate a second test sequence in response to the test priority of the first test item, wherein the second test sequence is different from the first test sequence; and
   testing a second device identical to the first device according to the second test sequence.

2. The method of claim 1, wherein the first test item in the second test sequence is in a position ahead of a position of the first test item in the first test sequence.

3. The method of claim 1, wherein the first test item in the second test sequence is not a top test item.

4. The method of claim 1 further comprising:
   after finishing testing the first test item, measuring a temperature of the first device.

5. The method of claim 1, wherein the first test item is a test chain comprising a plurality of test items having a fixed test sequence.

6. A method comprising:
   testing a first plurality of devices comprising executing a first test item and a second test item for the first plurality of devices, wherein a second plurality of devices among the first plurality of devices is most recently tested devices, and a first total count of the first plurality of devices is greater than a second total count of the second plurality of devices, and wherein among the second plurality of devices, a third plurality of devices failed on the first test item, and a fourth plurality of devices failed on the second test item;
   calculating a first test priority of the first test item, wherein the calculating the first test priority comprises dividing a first total count of the third plurality of devices by the second total count of the second plurality of devices to generate a first quotient;
   calculating a second test priority of the second test item, wherein the calculating the second test priority comprises dividing a second total count of the fourth plurality of devices by the second total count of the second plurality of devices to generate a second quotient;
   generating a first test sequence, wherein in the first test sequence, a first one of the first test item and the second test item having a higher test priority is placed ahead of a second one of the first test item and the second test item; and
   testing a device in an order of the first test sequence.

7. The method of claim 6, wherein the calculating the first test priority and the second test priority comprises:
   assigning a first weight and a second weight to the first test item and the second test item, respectively, wherein the first weight is different from the second weight; and
   multiplying the first weight and the second weight by the first quotient and the second quotient, respectively.

8. The method of claim 6, wherein the testing the device comprises executing the first test item on the device, and wherein the method further comprises:
   after finishing executing the first test item for the device, measuring a temperature of the device or an internal stress of the device;
   adjusting the first test sequence to generate a second test sequence in response to the temperature or the internal stress, wherein the second test sequence is different from the first test sequence; and
   finishing testing the device according to the second test sequence.

9. The method of claim 8, wherein the temperature of the device is measured, and wherein the adjusting the first test sequence to generate the second test sequence is in response to the temperature.

10. The method of claim 8, wherein the internal stress of the device is measured, and wherein the adjusting the first test sequence to generate the second test sequence is in response to the internal stress.

11. The method of claim 10, wherein the measuring the internal stress of the device is performed through a stress sensor placed in the device.

* * * * *